United States Patent [19]
Ishikura

[11] Patent Number: 5,646,577
[45] Date of Patent: Jul. 8, 1997

[54] SHF OUTPUT POWER AND CHANNEL FREQUENCY SWITCHING APPARATUS IN FPU SYSTEM

[75] Inventor: Masao Ishikura, Akiruno, Japan

[73] Assignee: Hitachi Denshi Kabushiki Kaisha, Tokyo, Japan

[21] Appl. No.: 538,647

[22] Filed: Oct. 4, 1995

[30] Foreign Application Priority Data

Oct. 6, 1994 [JP] Japan .................... 6-242453

[51] Int. Cl.$^6$ ........................... H03G 3/30
[52] U.S. Cl. ............... 330/279; 330/285; 327/530; 327/545
[58] Field of Search .................. 327/113, 143, 327/365, 407, 530, 560, 561, 562, 563, 545, 427; 330/129, 285, 279

[56] References Cited

U.S. PATENT DOCUMENTS

| | | |
|---|---|---|
| 5,278,517 | 1/1994 | Fujita .......................... 330/279 |
| 5,373,251 | 12/1994 | Kunimoto et al. ................ 330/129 |

*Primary Examiner*—Timothy P. Callahan
*Assistant Examiner*—Dinh T. Le
*Attorney, Agent, or Firm*—Antonelli, Terry, Stout & Kraus, LLP

[57] ABSTRACT

The SHF output power and channel frequency switching apparatus having an SHF power amplifier for amplifying an SHF signal and supplying the amplified SHF output power signal to a transmitting antenna, an amplification degree control circuit for controlling the amplification degree of the amplifier, an output power change-over switch for switching a plurality of levels of the SHF output power, a channel frequency change-over switch for switching channel frequencies of the output power signal, a memory having stored therein a table of control signals which are selected to have proper values for the respective positions of each of the output power change-over switch and the channel frequency change-over switch in order that a necessary output power level can be produced each time the channel frequency change-over switch is operated to switch, a control signal supply unit for reading from the table the control signals corresponding to the output power and channel frequency specified by the SHF output power change-over switch and the channel frequency change-over switch and for supplying the read control signals to the amplification degree control circuit to control the amplification degree of the SHF power amplifier.

3 Claims, 4 Drawing Sheets

MULTIPATH OCCURS

NO MULTIPATH

| FREQUENCY BAND | 7G | | | | 10G | | | |
|---|---|---|---|---|---|---|---|---|
| SHF OUTPUT CONTROL VOLTAGE | 5W | 1W | 0.1W | 2mW | 5W | 1W | 0.1W | 2mW |
| GATE CONTROL VOLTAGE | -1.5 | -2.5 | -3.2 | -3.5 | -1.3 | -2.3 | -3.0 | -3.2 |
| DRAIN CONTROL VOLTAGE | +10 | +3 | +1 | +0.5 | +9.5 | +2.8 | +0.9 | +0.4 |

|  | 7G | | | | 10G | | | |
| --- | --- | --- | --- | --- | --- | --- | --- | --- |
|  | 5W | 1W | 0.1W | 2mW | 5W | 1W | 0.1W | 2mW |
| GATE CONTROL | GD1 | GD2 | GD3 | GD4 | GD5 | GD6 | GD7 | GD8 |
| DRAIN CONTROL | DD1 | DD2 | DD3 | DD4 | DD5 | DD6 | DD7 | DD8 |

SHF OUTPUT POWER AND CHANNEL FREQUENCY SWITCHING APPARATUS IN FPU SYSTEM

BACKGROUND OF THE INVENTION

The present invention relates to an SHF output power and channel frequency switching apparatus in FPU system.

FIG. 1 is a general block diagram of a transmission HF section of an FPU system. In FIG. 1, to the IF input end is applied an intermediate frequency (IF) signal FM-modulated with a video signal from a control section of the FPU system. This intermediate frequency signal, which is an FM signal modulated on a carrier of 130 MHz, is first amplified by an IF amplifier 1 and fed to a frequency converter 2. This frequency converter 2 makes the modulated intermediate-frequency signal of 130 MHz mixed with a signal of 1370 MHz which is generated from a local oscillator 3, thereby producing a second IF signal of 1500 MHz. It also makes this second IF signal mixed with a local oscillation output from an SHF synthesizer 4, thus producing an SHF wave. This SHF wave signal is amplified up to a rated output by an SHF power amplifier 5 and fed as an SHF output to an antenna. A bias control circuit 6 shown is a circuit for changing the output power of the SHF power amplifier 5.

When the conventional FPU system is used for repeating in a close range of 1 km or below, and when the transmission power output is, for example, about 1 W, the normal wave of about −25 dBm and reflected wave of about −60 dBm can be received as shown in FIG. 3, that is, there is the so-called multipath effect which often causes troubles in the antenna directivity adjustment for the microwave. In order to counteract this effect, it was needed to increase the diameters of the parabola antennas, sharpen the directivity and direct it upward or to skillfully adjust the orientations of the antennas while detailed transmitting and receiving conditions are being sent between the transmitting and receiving sides.

If the transmission power output is reduced to, for example, 2 mW, the reflected wave level and normal wave level at the receiving side are about −90 dBm and −50 dBm, respectively as shown in FIG. 4. Since the minimum level which can be received is about −70 dBm, there is no multipath reception, that is, only the normal wave can be received.

The bias control circuit 6 is designed to change the transmission power output in the FPU system as the transmitter side so that only the normal SHF wave can be received without the multipath effect. Also, in the bias control circuit 6, since the frequency of the SHF wave to be transmitted is necessary to be selected and fixed in association with the receiving station, and since the SHF output power should be independent of the fixed frequency, a bias control signal is generated to prevent the SHF output power from being changed with the change of the frequency.

An example of the conventional circuit for changing the SHF output power will be described with reference to FIG. 2. FIG. 2 shows a specific example of the SHF power amplifier 5 and bias control circuit 6 illustrated in FIG. 1. In the prior art, the SHF output power can be switched between two values of, for example, 5 W and 1 W. To the bias control circuit 6 are supplied a 5 W/1 W switching command signal and a 7 G/10 G switching command signal which is produced from a control system circuit on the basis of a discrimination signal corresponding to one of the 7-GHz band channel frequency and 10-GHz band channel frequency which is selected in a ganged relation with the change of the oscillation frequency of the SHF synthesizer 4.

Switches S1 and S2 in FIG. 2 are operated by the 5 W/1 W switching command signal, and switches S3 through S6 by the 7 G/10 G switching command signal. Variable resistors VR1 through VR4 are adjusted to produce voltages corresponding to the combination of the power switching signal and the frequency switching signal and fed as gate control voltages to the gates of transistors FET 1 and FET 2 of the SHF power amplifier so that a certain power can be produced at each frequency. Variable resistors VR5 through VR8 are also adjusted to produce voltages as drain control voltages the drains of the transistors FET 1 and FET 2. The SHF power amplifier 5 is composed of several stages of FETs, and is changed in its amplification degree by the gate control voltages and drain control voltages of the FET 1 and FET 2 which are fed from the bias control circuit 6.

In the prior art two-position switching is made between 5 W and 1 W. It is possible to make multi-position switching for SHF power. In this case, a proper power level can be selected by a multi-position switching for SHF power in accordance with the repeating distance, for example, close-range repeating or long-range repeating, thereby removing the multipath effect.

FIG. 5 shows an example of the multi-position switching of SHF power which was tentatively thought of by the inventor (not prior art), or a circuit for making four-position switching of 5 W, 1 W, 0.1 W and 2 mW. In this example, it is necessary to stepwise change the drain control voltage and gate control voltage of the SHF power amplifier in eight stages as, for example, shown in FIG. 6. For changing the control voltages, voltage dividing circuits can be used which are formed of combinations of fixed resistors. However, considering that the power supply voltages are not always constant, variable resistors are generally used, and thus variable resistors VR1 through VR 16 are necessary as shown in FIG. 5. Therefore, each time the number of switching positions is increased by one, four variable resistors are necessary to be added, thus increasing the circuit package space and adjusting time.

Simply improving the conventional circuits for SHF power multi-position switching will result in the increase in the circuit scale. Therefore, the system cannot be small-sized, and the adjusting time becomes long because the number of variable resistors increases.

SUMMARY OF THE INVENTION

It is an object of the invention to provide an FPU system having a multi-position switching function for SHF power with the above drawbacks obviated.

According to this invention, in order to achieve the above object, as the means for generating the bias control voltages to the SHF power amplifier, various data concerning the combinations of the power levels at the respective positions of the SHF power change-over switch and the channel frequencies are stored in a memory (ROM), and the values selected by the power change-over switch and channel frequency change-over switch are fed to a CPU. Then, the data corresponding to the selected values are read from the memory and produced from the CPU. This digital signal is converted into an analog signal by a D/A converter to thereby produce bias control voltages.

As a result, once the data for gate control and drain control by which proper transmission power is transmitted in accordance with channel and power are stored in the ROM, the correct gate and drain control voltages are always supplied to the power amplifier in accordance with the selection of a channel and power.

DESCRIPTION OF THE PREFERRED EMBODIMENTS

Figure 1:
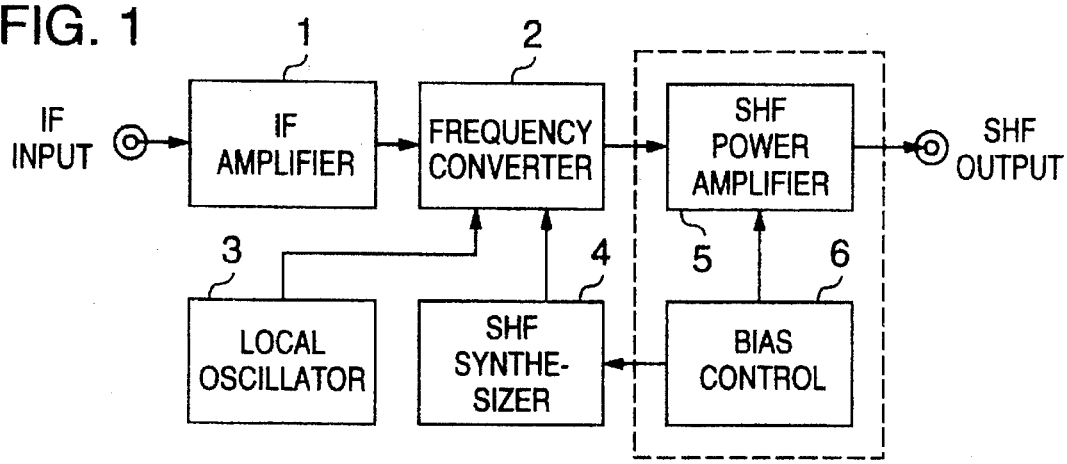
FIG. 1 is a block diagram showing the general construction of the HF section of the FPU system according to this invention.
Figure 2:
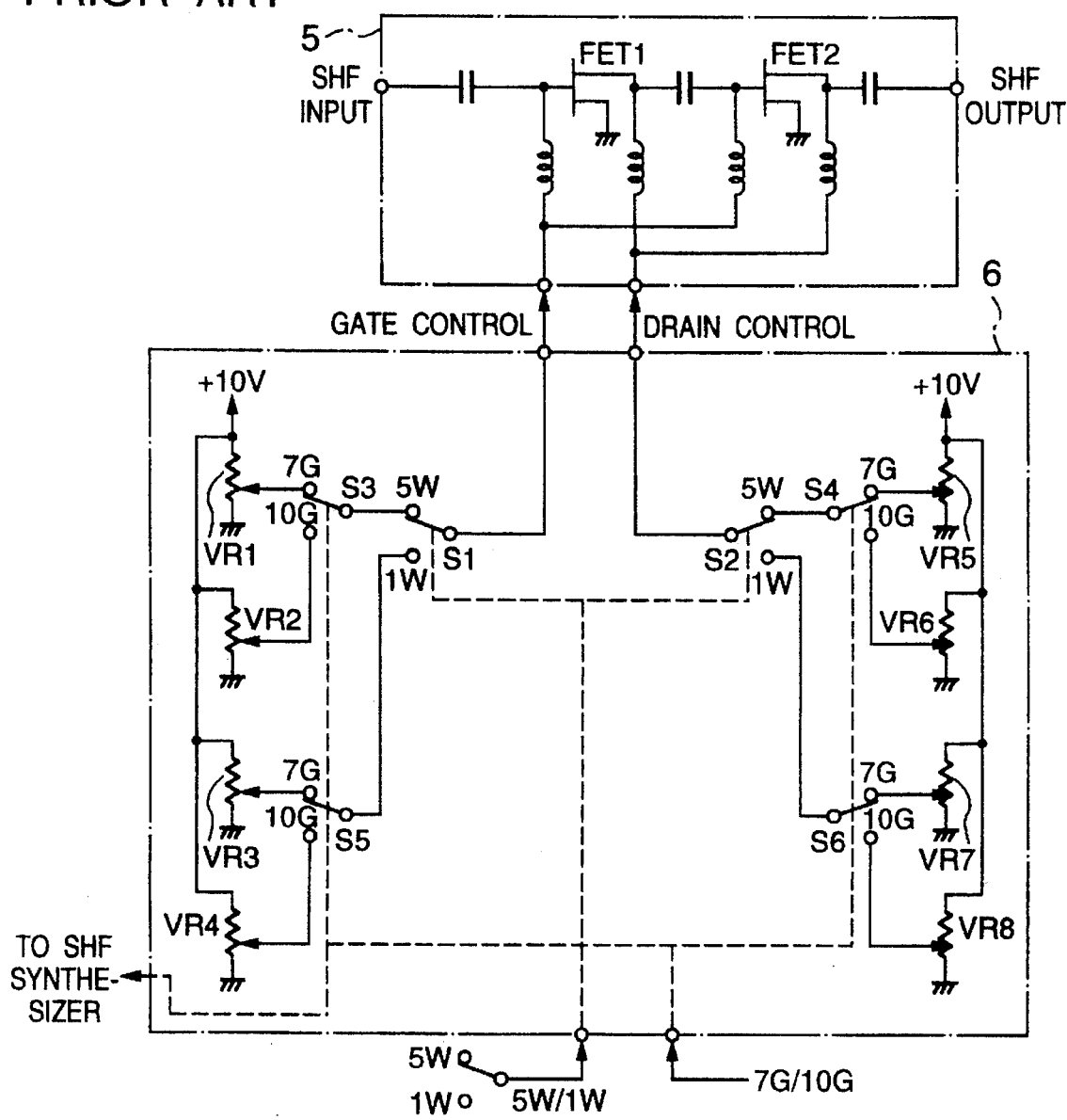
FIG. 2 is a circuit diagram showing the prior art of a main part of FIG. 1.
Figure 3:
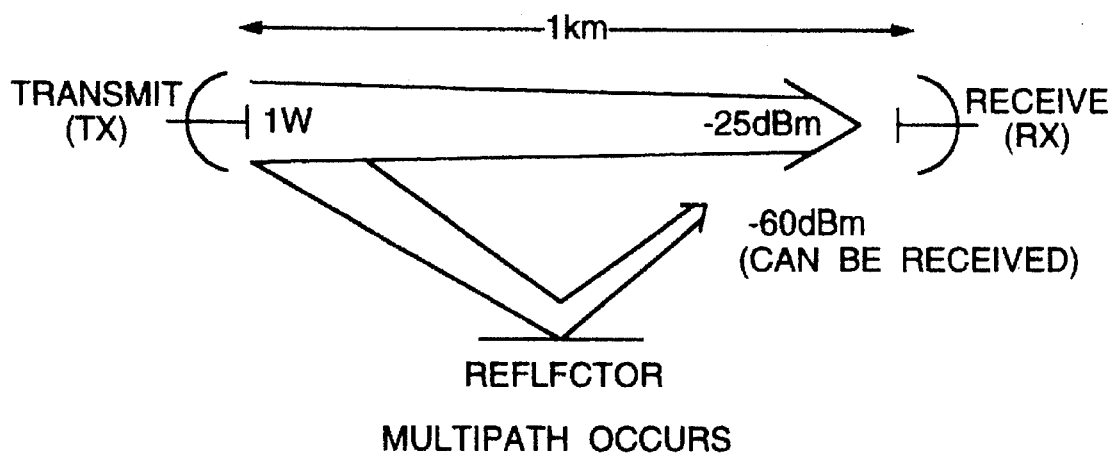
FIG. 3 and 4 are diagrams for use in explaining the multipath effect which is removed by the present invention.
Figure 4:
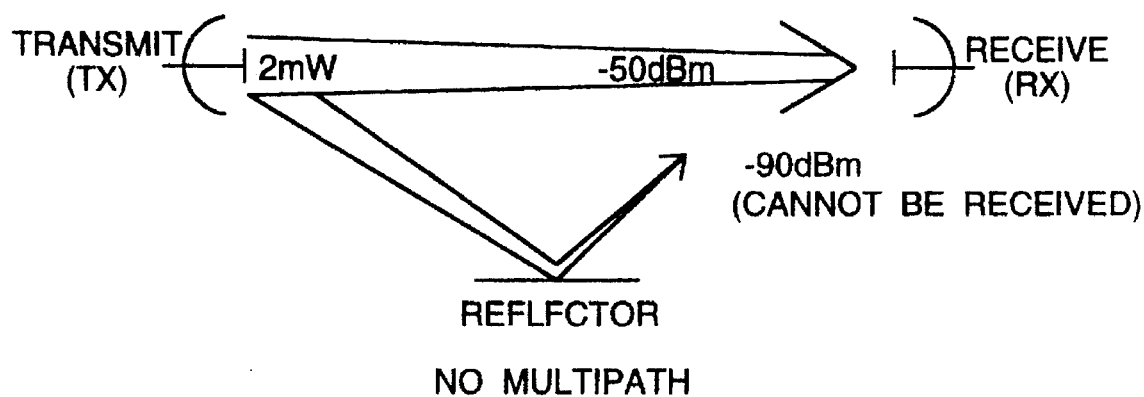
Figures 5, 6:
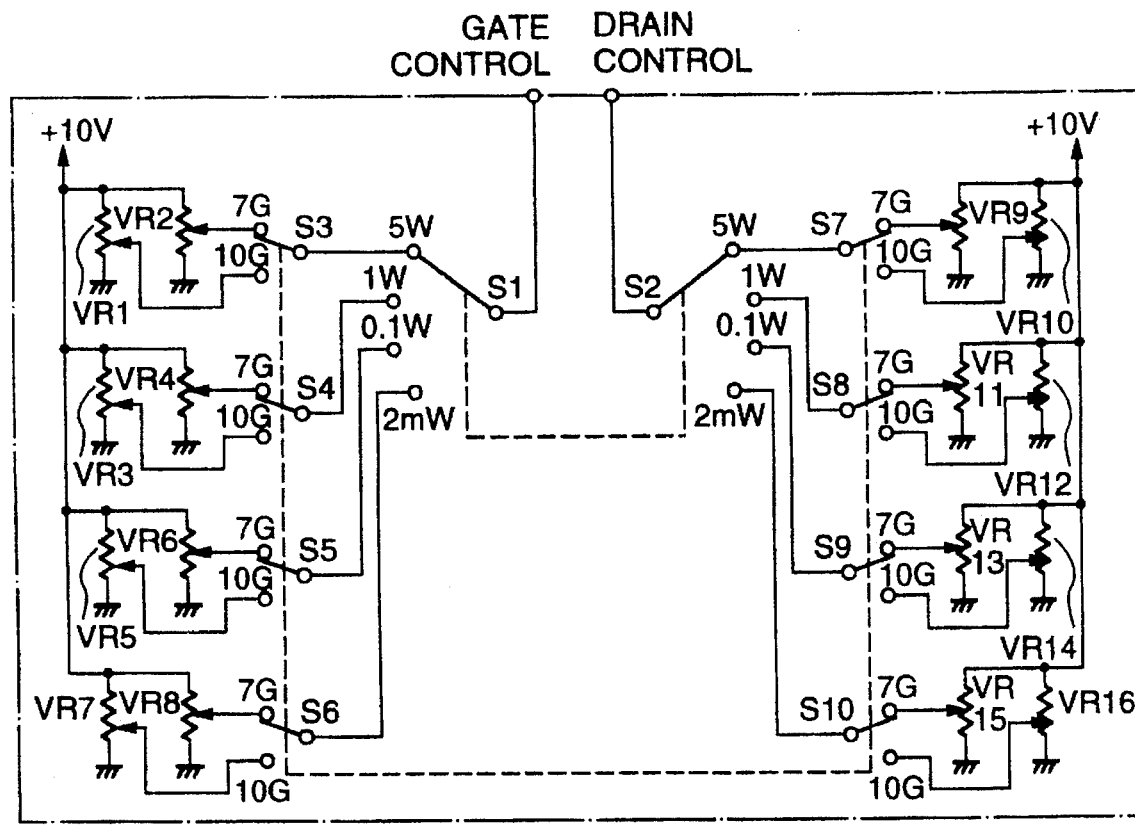
FIG. 5 is a diagram of a circuit devised from the prior art.
FIG. 6 is a table showing examples of control voltages by which a plurality of portions in the circuits of FIG. 5 are controlled.
Figures 7, 8:
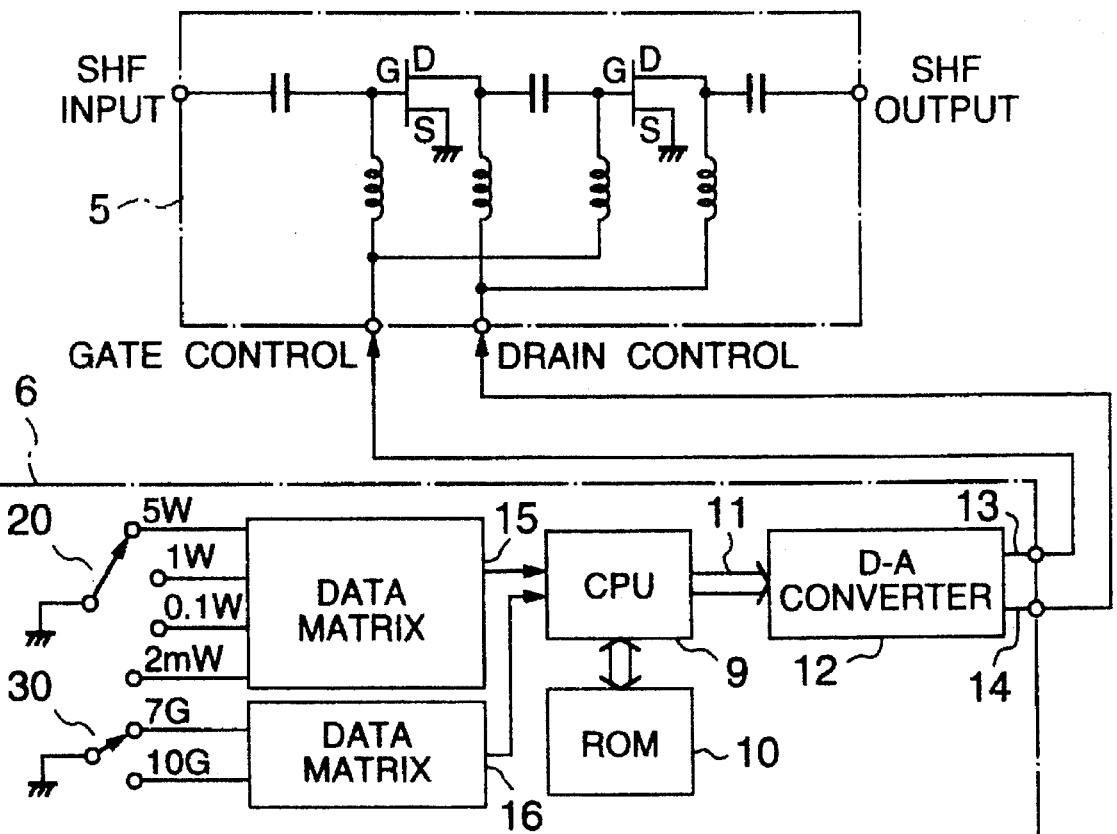
FIG. 7 is a circuit diagram of one embodiment of the invention.
FIG. 8 is a table showing examples of control voltages fed in the circuits of FIG. 7.

One embodiment of the invention will be described with reference to the bias control circuit in FIG. 7. When an output power level is selected by an SHF power change-over switch 20, the selected position of the switch becomes zero potential. Then, a data matrix circuit 15 is responsive to the zero potential to generate data of the selected power level. This data is supplied to a CPU 9. On the other hand, when a channel to be used is selected by a channel frequency change-over switch 30, the selected position of the switch becomes zero potential, and then a data matrix circuit 16 is responsive to the zero potential to generate channel specifying data (frequency specifying data) and supplies it to the CPU 9.

In the frequency converter 2, the oscillation frequency of the SHF synthesizer 4 as the local oscillator for determining the output frequency is fixed on the basis of the channel specifying data fed to the CPU when the channel frequency is selected by the switch.

The switches 20 and 30 are mounted on the front operation panel of the FPU system in order to be operated with ease. In this embodiment, the SHF power change-over switch 20 has four contact positions one of which is selected to become zero potential and sensed by the data matrix 15 the output of which is fed to the CPU. Similarly, the selected one of the four contact positions of the switch 30 is sensed by the data matrix 16, and the resulting output is fed to the CPU 9. A memory (ROM) 10 has stored therein, as for example shown in FIG. 8, gate control data GD1 through GD8 and drain control data DD1 through DD8 which are supplied to, for example, two FETs of the SHF power amplifier 5. Although the SHF power levels to be selected are 5W, 1 W, 0.1 W and 2 mW as shown in FIG. 8, the number of positions of the switch 20, 30 can be increased and thus in this case data according thereto are added.

Even if the channel frequency is switched between 7 GHz band (C, D band, 6.4 GHz through 7.2 GHz) and 10 GHz band (E, F band, 10.25 GHz through 10.68 GHz), the output power of the SHF power amplifier 5 is optimized so that the frequency-gain characteristic can be corrected to be constant since the gate and drain bias voltages are increased or decreased, each time the frequency is changed, as shown in the table in which separate control data are provided for two frequency bands. The data corresponding to the specified power data selected by the SHF power change-over switch 20 is read from the ROM by the CPU, and this read data 11 is converted into analog signals 13, 14 by a D-A converter 12. The analog signals 13 and 14 are supplied as gate control voltage and drain control voltage to the SHF power amplifier 5, respectively.

The output power of the SHF power amplifier 5 is changed by changing the gate control voltage (DC voltage) and drain control voltage (DC voltage) since its gain is changed by those voltages. The channel frequency bands, or 7 GHz band and 10 GHz band, are discriminated from each other since the frequency data corresponding to the frequency specified by the channel change-over switch 30 is read by the CPU from the ROM in which the frequency data of 7 GHz band through 10 GHz band are previously written.

Since the FETs used in the SHF power amplifier 5 have slight difference in their characteristics, it is considered that the proper gate and drain control voltages are changed after the assembly of the SHF power amplifier. Therefore, if, after the assembly of the SHF power amplifier and before its shipment, the characteristics of the SHF power amplifier are measured and the values of GD1 through GD8, DD1 through DD8 shown in FIG. 8 are stored in the ROM, the SHF power can be obtained at a desired frequency.

While in the above embodiment the selected contact terminals of the SHF power and frequency change-over switches are held at zero potential, a predetermined signal instead may be applied to the CPU 9.

According to this invention, when the system is used for various long-or short-distance transmission and reception operations, the multipath effect due to excessive SHF output power can be prevented by realizing the multi-position switching function for SHF power without increasing the number of components.

I claim:

1. A SHF (Super High Frequency) output power switching apparatus in a FPU (Field Pick-Up) system comprising:
   (a) SHF power amplifier for amplifying a SHF signal and supplying an amplified SHF output power to a transmitting antenna, said SHF power amplifier including at least one FET device having gate, drain and source terminals; and
   (b) bias control means coupled with said SHF power amplifier for controlling an amplification of said SHF power amplifier by applying variable control voltages to at least one of said gate and drain terminals of said FET amplifier in such a manner that said SHF power amplifier is selectable to amplify at a plurality of different power levels to prevent multi-path effect according to a transmission path;
   said bias control means comprising:
      (1) SHF output power change-over switch means having a plurality of selectable positions corresponding to a plurality of amplification power levels to be switched, for stepwise changing a bias voltage supplied to said SHF power amplifier;
      (2) memory means for storing a plurality of bias voltage control data corresponding to different control voltages to be applied to at least one of said gate and drain terminals of said FET device and corresponding to said respective different amplification power levels of said SHF power amplifier for transmission;
      (3) reading means coupled with said memory means for reading said bias voltage control data from said memory means; and
      (4) data generating means coupled between said SHF output power change-over switch means and said reading means for controlling said reading means so that said bias voltage control data corresponding to one of said selectable positions of said SHF output power change-over switch means which is selected, are read, whereby said bias control means generates corresponding control voltages to be applied to at least one of said gate and drain terminals of said FET device to set said amplification power level of said SHF output power amplifier to prevent multi-path effect according to said transmission path.

2. An SHF output power switching apparatus according to claim 1, wherein said bias control means further comprises channel frequency change-over switch means for changing a channel frequency, and said memory means further stores a plurality of bias voltage control data corresponding to said channel frequency to be changed, and said control means for further controlling said reading means so that said bias voltage control data corresponding to said channel frequency to be changed are read.

3. An SHF output power switching apparatus according to claim 2, wherein said SHF power amplifier has at least two FET devices and said bias control means controls at least one of the gate voltage and drain voltage of said FET devices.

* * * * *